(12) United States Patent
Kim et al.

(10) Patent No.: US 9,927,495 B2
(45) Date of Patent: Mar. 27, 2018

(54) OFFSET COMPENSATION METHOD AND SYSTEM OF HALL SENSOR IN MOTOR

(71) Applicant: Hyundai Motor Company, Seoul (KR)

(72) Inventors: Sung Do Kim, Gyeonggi-do (KR); Min Su Kang, Gyeonggi-do (KR); Dong Hun Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 25 days.

(21) Appl. No.: 14/846,779

(22) Filed: Sep. 6, 2015

(65) Prior Publication Data

US 2016/0109531 A1 Apr. 21, 2016

(30) Foreign Application Priority Data

Oct. 17, 2014 (KR) .................. 10-2014-0140461

(51) Int. Cl.
| | | |
|---|---|---|
| *G01B 7/00* | (2006.01) | |
| *G01R 33/025* | (2006.01) | |
| *G01R 33/00* | (2006.01) | |
| *G01D 5/14* | (2006.01) | |
| *G01R 33/07* | (2006.01) | |
| *G01D 5/244* | (2006.01) | |
| *G01P 3/487* | (2006.01) | |
| *G01P 21/02* | (2006.01) | |

(52) U.S. Cl.
CPC ......... *G01R 33/0017* (2013.01); *G01D 5/145* (2013.01); *G01D 5/2448* (2013.01); *G01D 5/2449* (2013.01); *G01P 3/487* (2013.01); *G01P 21/02* (2013.01); *G01R 33/0029* (2013.01); *G01R 33/07* (2013.01)

(58) Field of Classification Search
CPC ................ G01R 33/0017; G01R 33/07; G01R 33/0029; G01D 5/145
USPC .............................. 324/207.12, 200, 207.11
See application file for complete search history.

(56) References Cited

U.S. PATENT DOCUMENTS

| | | | | |
|---|---|---|---|---|
| 4,514,685 A | * | 4/1985 | Gilker ................... | G01R 21/08 324/103 R |
| 5,604,433 A | * | 2/1997 | Theus ................... | G01R 33/07 324/225 |
| 7,808,200 B2 | | 10/2010 | Liu et al. | |
| 2014/0259637 A1 | * | 9/2014 | Hannewald ............ | H02K 29/08 29/598 |

(Continued)

FOREIGN PATENT DOCUMENTS

| | | |
|---|---|---|
| CN | 103453929 A | 12/2013 |
| JP | 2007-014189 A | 1/2007 |

(Continued)

*Primary Examiner* — Giovanni Astacio-Oquendo
(74) *Attorney, Agent, or Firm* — Mintz Levin Cohn Ferris Glovsky and Popeo, P.C.; Peter F. Corless

(57) ABSTRACT

An offset compensation method and system of a hall sensor in a motor are provided. The system and method prevent a detection error regarding the position of the rotor of the motor and more accurately measure the speed and location of a rotor by storing the position of when output values of three hall sensors while slowly rotating the rotor by adding control mode for applying a low speed rotating magnetic field to a controller, extracting and storing offsets between each hall sensor and the U-phase position of a stator winding, and then excluding the influence of the offset of a rotor magnet in normal operation mode.

15 Claims, 4 Drawing Sheets

(56) References Cited

U.S. PATENT DOCUMENTS

| | | | | |
|---|---|---|---|---|
| 2015/0245593 A1* | 9/2015 | O'Mara | ............... | A01K 15/025 |
| | | | | 446/457 |
| 2015/0295525 A1* | 10/2015 | Liu | ........................ | H02P 6/16 |
| | | | | 318/400.04 |
| 2016/0154066 A1* | 6/2016 | Hioka | ............... | G01R 33/0017 |
| | | | | 324/224 |

FOREIGN PATENT DOCUMENTS

| | | |
|---|---|---|
| JP | 2008-115752 A | 5/2008 |
| KR | 10-2005-0067914 A | 7/2005 |
| KR | 10-2007-0095606 A | 10/2007 |
| KR | 10-2011-0117755 A | 10/2011 |
| KR | 10-1283963 B1 | 7/2013 |
| KR | 10-1293082 B1 | 8/2013 |
| KR | 10-2014-0074538 A | 6/2014 |

\* cited by examiner

OFFSET COMPENSATION METHOD AND SYSTEM OF HALL SENSOR IN MOTOR

CROSS-REFERENCE TO RELATED APPLICATION

This application claims under 35 U.S.C. § 119(a) the benefit of Korean Patent Application No. 10-2014-0140461 filed Oct. 17, 2014, the entire contents of which are incorporated herein by reference.

BACKGROUND (a) Technical Field

The present invention relates to an offset compensation method and system of a hall sensor in a motor, and more particularly, to an offset compensation method of a hall sensor in a motor that can prevent a detection error regarding the position of the motor rotor.

(b) Background Art

Eco-friendly vehicles including fuel cell vehicles, electric vehicles, hybrid vehicles, and plug-in electric vehicles are equipped with a plurality of motors for electricity generation and driving, and are equipped with hall sensors for detecting the revolutions per minute (RPM) of each motor to more accurately control the driving of the motors. The hall sensors are disposed at a particular angle on certain positions of each motor, and generate on or off digital signals when the rotor of the motor rotates to output the position information of the rotor. Based on the position information of the rotor, a series of motor driving controls (e.g., calculation of motor speed) may be executed.

Further, a blower configured to supply air into a fuel cell system, i.e. an air blower having a form in which an aerodynamic part is added to a motor includes a Surface Mounted Permanent Magnetic Synchronous Motor (SMPMSM), and a hall sensor that is a type of position sensor to detect the position of the rotor and measure the speed of the rotor. The hall sensor is mounted onto the end plate side of a cylindrical motor housing, and three hall sensors are disposed at a uniform interval of 120 degrees to measure the rotation speed of tens of thousands of RPM.

A controller (e.g., three-phase voltage-type inverter, hereinafter, referred to as "inverter") connected to the air blower is configured to configured direct current (DC) power of high-voltage terminal into three-phase alternating power using Space Vector Pulse Width Modulation (SVPWM) to rotate an electric motor. Thus, a coaxial impeller is configured to supply air into the fuel cell system by pushing air while rotating. To rotate the rotor using an attractive force and a repulsive force between the rotor (e.g., permanent magnet) and the rotating magnetic field generated using SVPWM control of the permanent magnet motor, the position of the rotor magnet should be accurately measured. However, since the position of the rotor magnet is measured by the output value based on the arrangement of the hall sensor mounted onto the motor housing, the manufacturing error that occurs upon mounting of the hall sensors may cause the speed error and the position error of the rotor.

Hereinafter, a typical operation of detecting the position of the motor rotor using hall sensors will be described below.

FIG. 1 is an exemplary view illustrating an arrangement structure of a stator, a rotor, and hall sensors of a motor. When an air blower is manufactured to supply air into a fuel cell system, three hall sensors A, B and C are mounted within the housing at a uniform interval of 120 degrees. The housing also includes a stator and a winding.

Accordingly, upon application of a U-phase current of three-phase coordinate system, an angle offset between the position (hereinafter, referred to as U-phase position) at which a magnetic field is generated and the hall sensor A is a 'rotor position offset', and this rotor position offset is stored within a controller to be used to measure the position of the rotor. Thus, when the position of the rotor is measured, it may be assumed that the hall sensors A, B and C are accurately disposed at an angle of 120 degrees and that the hall sensor A and the U-phase position have an accurate angle offset.

FIG. 2 is an exemplary view illustrating a measurement process of a hall sensor when the rotation direction of the rotor is determined based on the movement of a rotating magnetic field. In particular, the rotation direction of the rotor is determined based on the movement of the rotating magnetic field of the motor. The position of the rotor is measured using output values of the hall sensor.

The hall sensor is configured to output high in N-polar direction, and output low in S-polar direction. Additionally, since the hall sensors A, B and C are disposed at an interval of 120 degrees, the output changes of the hall sensors may occur six times per one rotation of the rotor. The output values of the hall sensors are described in Table 1 below.

TABLE 1

| Section | Hall Sensor | | |
|---|---|---|---|
| | A | B | C |
| 1 | 1 | 0 | 0 |
| 2 | 1 | 1 | 0 |
| 3 | 0 | 1 | 0 |
| 4 | 0 | 1 | 1 |
| 5 | 0 | 0 | 1 |
| 6 | 1 | 0 | 1 |

As described in Table, a section that the N-polar of the rotor faces is determined based on the output value of the hall sensors. Additionally, the direction is determined based on the changing order of each hall sensor. However, when the installation positions of the hall sensors deviate from desired positions, the position of the rotor by the rotating magnetic field and the section based on the position of the hall sensors shown in FIG. 2 may be sensed as different from the actual position of the rotor.

In other words, the position error that occurs during the mounting of the hall sensor A having an offset falling within an allowable error in the U-phase position of the stator winding, i.e., the position error that occurs in a process of mounting the hall sensors B and C at intervals of 120 degrees and 240 degrees with respect to the hall sensor A affects the change of the output value of the hall sensors, causing the calculation error of the speed and position of the rotor.

Furthermore, the speed error of the rotor may cause a ripple in regard to an output current command of a speed controller, reducing the stability of a current controller. In addition, the position error of the rotor may be an error of the rotor position angle used in the current controller, causing a ripple of a three-phase motor output current and thus reducing the electrical efficiency and causing heating of the motor as well as wobble of the motor rotation speed.

The above information disclosed in this section is merely for enhancement of understanding of the background of the invention and therefore it may contain information that does not form the prior art that is already known in this country to a person of ordinary skill in the art.

SUMMARY

The present invention provides an offset compensation method of a hall sensor in a motor, which may measure the speed and location of a rotor more accurately by recording the position at the time when output values of three hall sensors while slowly rotating the rotor by adding control mode for applying a low speed rotating magnetic field to a controller, extracting and storing offsets (e.g., angles) between each hall sensor and the U-phase position of a stator winding, and then excluding the influence of the offset of a rotor magnet in normal operation mode.

In one aspect, the present invention an offset compensation method of a hall sensor in a motor may include: detecting whether an offset compensation of a hall sensor is completed; entering a control mode to apply a low speed rotating magnetic field when the offset compensation of the hall sensor is not completed; storing an initial output value of the hall sensor to acquire a current position of a rotor when an input voltage for a motor is generated; determining a change of output values of the hall sensor while rotating the rotor of the motor at a substantially low speed; storing an offset value between a U-phase position and the hall sensor when the output value of the hall sensor changes; and completing the control mode for applying the substantially low speed rotating magnetic field.

BRIEF DESCRIPTION OF THE DRAWINGS

The above and other features of the present invention will now be described in detail with reference to exemplary embodiments thereof illustrated the accompanying drawings which are given hereinbelow by way of illustration only, and thus are not limitative of the present invention, and wherein.

Figure 1:
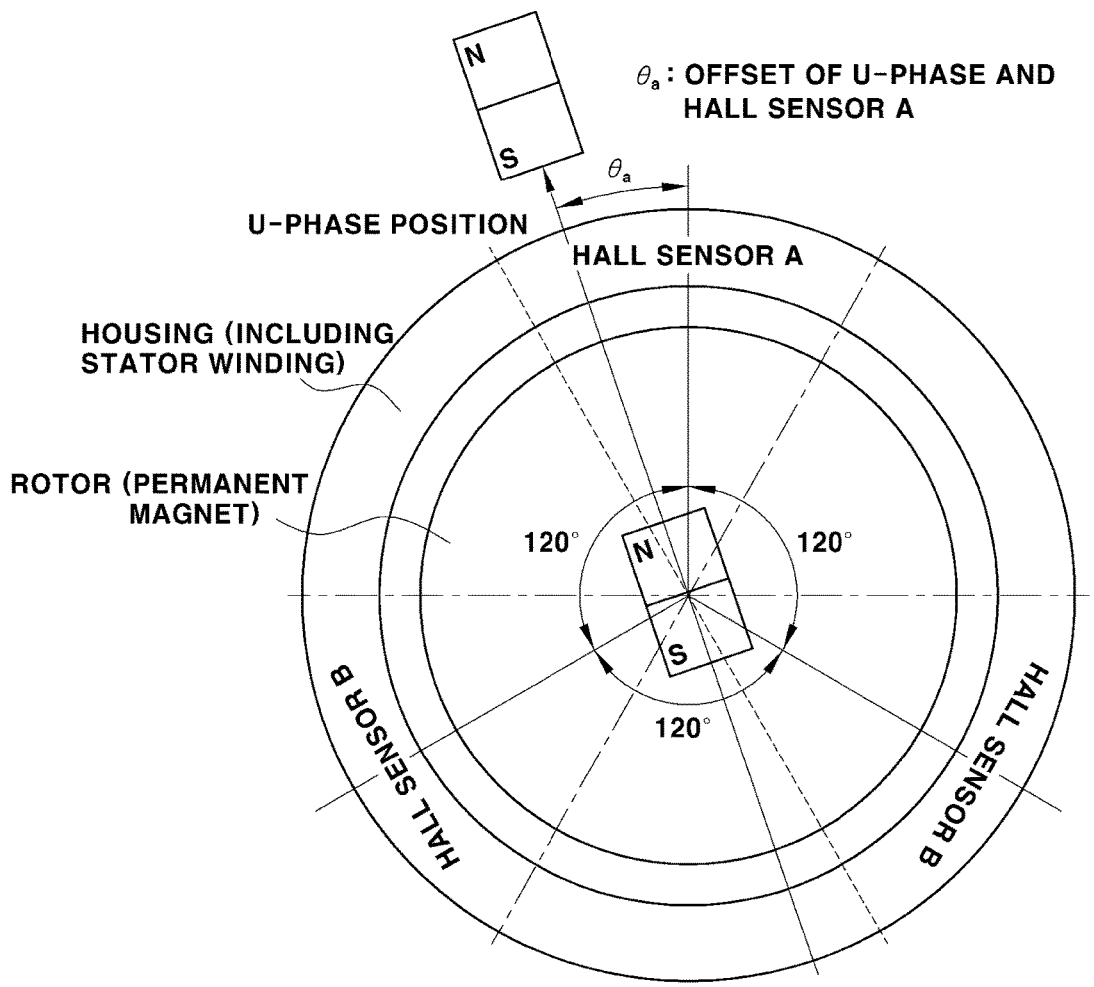
FIG. 1 is an exemplary view illustrating an arrangement structure of a stator, a rotor, and hall sensors of a motor according to the related art.
Figure 2:
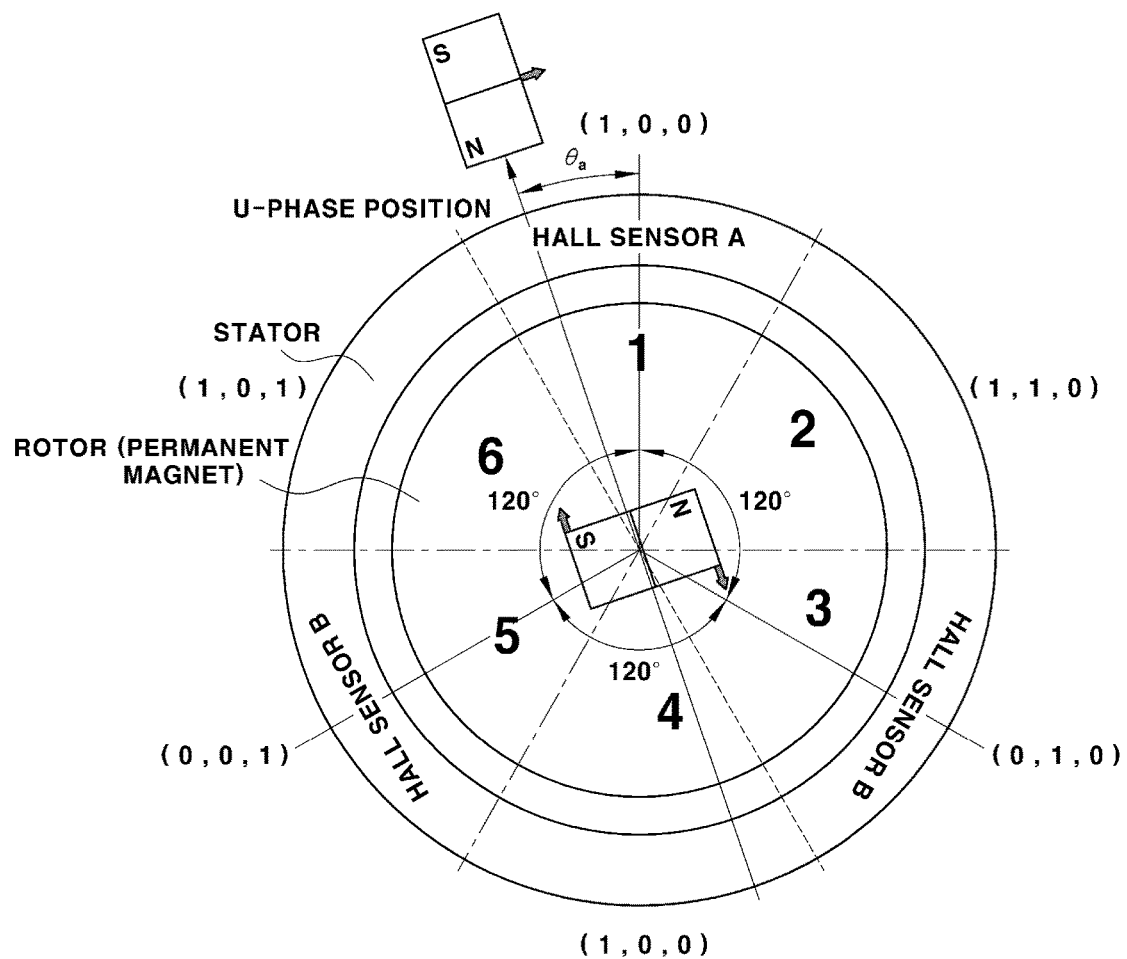
FIG. 2 is an exemplary view illustrating a measurement process of a hall sensor when the rotation direction of the rotor is determined based on the movement of a rotating magnetic field according to the related art.

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", an and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described in detail with reference to the accompanying drawings so that those skilled in the art can easily carry out the present invention.

The present invention is focused on a point that the offset of a hall sensor may be compensated by preemptively detecting the position differences of hall sensors A, B and C and the U-phase position that is a criterion of three-phase coordinate system, using control mode for applying a low speed rotating magnetic field, i.e., control mode for storing the position of when the output value of the three hall sensors change while slowly rotating a rotor. Notably, the low speed may be about 1 revolutions per minute (rpm) and accuracy of the error determination may be improved by the slow rotation.

Figure 3:
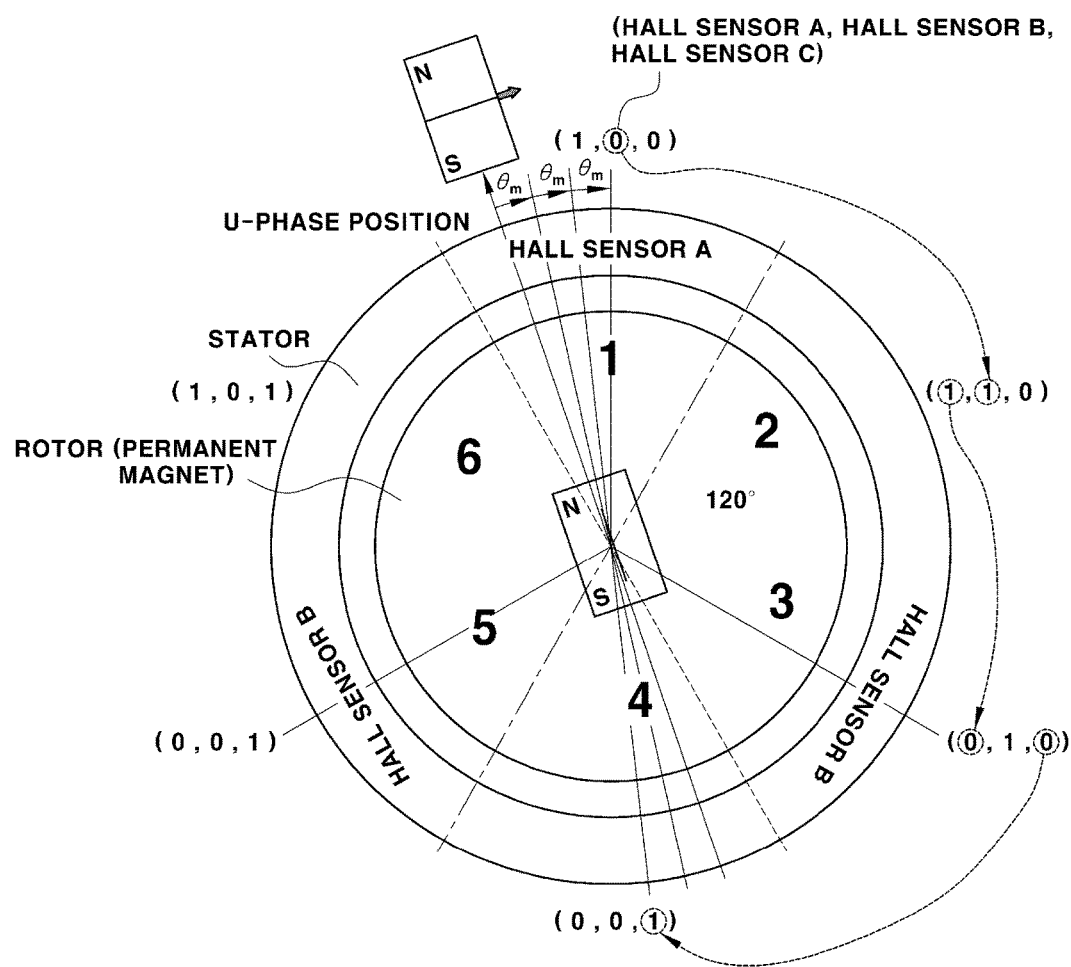
FIG. 3 is an exemplary view illustrating the configuration of a motor for describing an offset compensation method of a hall sensor in a motor according to an exemplary embodiment of the present invention.
Figure 4:
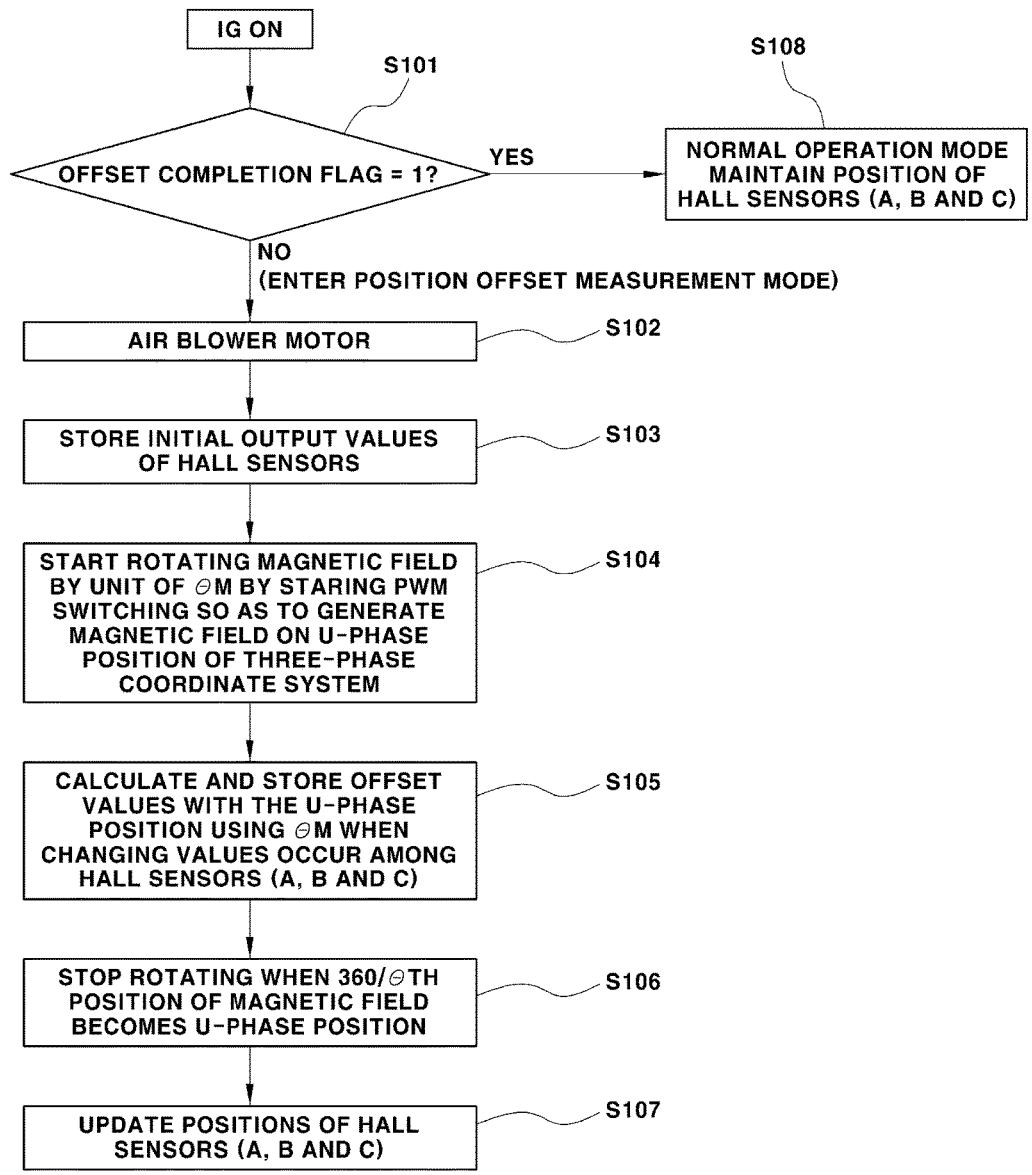
FIG. 4 is an exemplary control flowchart illustrating an offset compensation method of a hall sensor in a motor according to an exemplary embodiment of the present invention.

FIG. 3 is an exemplary view illustrating the configuration of a motor for describing an offset compensation method of a hall sensor in a motor according to an exemplary embodiment of the present invention. FIG. 4 is an exemplary control flowchart illustrating an offset compensation method of a hall sensor in a motor according to an exemplary embodiment of the present invention.

First, a controller may be configured to detect whether the offset compensation of the hall sensor is completed (S1010). When the offset compensation of the hall sensor is completed, the normal operation mode (e.g., a mode of adjusting the speed based on a speed command received from the controller) may begin to measure the rotor position of a motor using the hall sensors (S108). In addition, when the offset compensation of the hall sensor is not completed, the controller may be configured to enter a control mode for applying the low speed rotating magnetic field. In particular, an air blower configured to supply air into a fuel cell, i.e., a motor of the air blower may be configured to wait for generation of an input voltage (S102).

Further, when the input voltage the motor is generated, initial output values of the hall sensors may be stored to detect the current position of a rotor. The change of the output values of the hall sensors may be observed while the rotor of the motor slowly rotates. In other words, the magnetic field applied to the U-phase position may move by unit of θm, and at this point, the change of the output values of the hall sensors may be observed, by a controller configured to start pulse width modulation (PWM) switch control to generate the magnetic field in the U-phase position of three-phase coordinate system (S104).

Referring to FIG. 3, when a section change occurs among the hall sensors, the output values of the hall sensor may change. When the movement distance θm of the magnetic field from the U-phase position is summed up, offset values between the U-phase position and the hall sensors may be more accurately acquired. As the unit angle θm decreases, the more accurate position of the hall sensor may be acquired. Accordingly, when the output values of the hall sensors A, B and C change, the offset values between the U-phase position and the hall sensors may be measured by moving the magnetic field by unit of θm, and the measured offset values may be stored in the controller (S105).

In particular, when 360/θm position becomes the U-phase position during the movement of the magnetic field, the controller may be configured to stop the rotation of the rotor, and complete the control mode for applying the low speed rotating magnetic field (S106). Additionally, after the offset values of the hall sensors A, B and C with respect to the U-phase position are stored in a specific memory region of the controller and the control mode for applying the low speed rotating magnetic field is complete, the controller may be configured to update the positions of the hall sensors A, B and C based on the offset values (S107).

Accordingly, offset information regarding the offset angle between the U-phase position and the hall sensor A, offset information regarding the offset angle between the U-phase position and the hall sensor B, and offset information regarding the offset angle between the U-phase position and the hall sensor C may be stored in a memory of the controller, and thus the offset information may be used when the direction of a rotor magnet is determined during the PWM control of the controller after the conversion of the normal operation mode. The position of the rotor may thus be more accurately measured by the controller. Based on the control mode for applying the low speed rotating magnetic field of the controller, the offset information regarding the hall sensors that deviate from desired positions during the manufacturing of the motor may be acquired, and more accurate position of the rotor may be determined from the offset information.

The present invention has the following effects.

First, the position of the rotor may be more accurately detected using offset information when the direction of the rotor magnet during the PWM control of the controller, by detecting offset information with the U-phase position and gap offset through the control mode for detecting the offset of the three hall sensors from the U-phase position.

Additionally, a current loss unnecessarily consumed at an incorrect position or the rotor and a speed ripple according to the offset of the rotor may be reduced, and thus the accuracy and efficiency of the motor speed may be improved. The improvement of the motor efficiency may be achieved by stabilizing the output start of a speed controller and by reducing the output current of the inverter, i.e., the phase current ripple of the motor.

The invention has been described in detail with reference to exemplary embodiments thereof. However, it will be appreciated by those skilled in the art that changes may be made in these exemplary embodiments without departing from the principles and spirit of the invention, the scope of which is defined in the appended claims and their equivalents.

What is claimed is:

1. An offset compensation method of a hall sensor in a motor, comprising:
    detecting, by a controller, whether an offset compensation of the hall sensor is completed;
    entering, by the controller, a control mode for applying a low speed rotating magnetic field when the offset compensation of the hall sensor is not completed;
    storing, by the controller, an initial output value of the hall sensor to determine a current position of a rotor when an input voltage for the motor is generated;
    determining, by the controller, a change of output values of the hall sensor while rotating the rotor of the motor at a low speed;
    storing, by the controller, an offset value between a U-phase position and the hall sensor when the change of the output values of the hall sensor is determined; and
    completing, by the controller, the control mode for applying the low speed rotating magnetic field.

2. The offset compensation method of claim 1, wherein in detecting whether the offset compensation of the hall sensor is completed, the controller is configured to enter a normal operation mode in which the hall sensor is configured to measure the position of the rotor of the motor when the offset compensation of the hall sensor is completed.

3. The offset compensation method of claim 1, wherein in the determining of the change of the output values of the hall sensor, the change of the output values of the hall sensor is determined by the controller when the magnetic field applied to the U-phase position moves by unit of θm, by starting pulse width modulation (PWM) switching control to generate the magnetic field in the U-phase position of a three-phase coordinate system.

4. The offset compensation method of claim 1, wherein in the storing of the offset value between the U-phase position and the hall sensor, when the movement distance θm of the magnetic field from the U-phase position is summed up to measure to the offset value between the U-phase position and the hall sensor.

5. The offset compensation method of claim 1, wherein in the completing of the control mode, when 360/θm position becomes the U-phase position during the movement of the magnetic field, the control mode for applying the low speed rotating magnetic field is completed by the controller.

6. An offset compensation system of a hall sensor in a motor, comprising:
 a memory configured to store program instructions; and
 a processor configured to execute the program instructions, the program instructions when executed configured to:
  detect whether an offset compensation of the hall sensor is completed;
  enter a control mode for applying a low speed rotating magnetic field when the offset compensation of the hall sensor is not completed;
  store an initial output value of the hall sensor to determine a current position of a rotor when an input voltage for the motor is generated;
  determine a change of output values of the hall sensor while rotating the rotor of the motor at a low speed;
  store an offset value between a U-phase position and the hall sensor when the output values of the hall sensor changes; and
  complete the control mode for applying the low speed rotating magnetic field.

7. The offset compensation system of claim 6, wherein in detecting whether the offset compensation of the hall sensor is completed, the program instructions when executed are further configured to enter a normal operation mode in which the hall sensor is configured to measure the position of the rotor of the motor when the offset compensation of the hall sensor is completed.

8. The offset compensation system of claim 6, wherein in the determining of the change of the output values of the hall sensor, the change of the output values of the hall sensor is determined when the magnetic field applied to the U-phase position moves by unit of θm, by starting pulse width modulation (PWM) switching control to generate the magnetic field in the U-phase position of a three-phase coordinate system.

9. The offset compensation system of claim 6, wherein in the storing of the offset value between the U-phase position and the hall sensor, when the movement distance θm of the magnetic field from the U-phase position is summed up to measure to the offset value between the U-phase position and the hall sensor.

10. The offset compensation system of claim 6, wherein in the completing of the control mode, when 360/θm position becomes the U-phase position during the movement of the magnetic field, the control mode for applying the low speed rotating magnetic field is completed.

11. A non-transitory computer readable medium containing program instructions executed by a controller, the computer readable medium comprising:
 program instructions that detect whether an offset compensation of a hall sensor is completed;
 program instructions that enter a control mode for applying a low speed rotating magnetic field when the offset compensation of the hall sensor is not completed;
 program instructions that store an initial output value of the hall sensor to determine a current position of a rotor when an input voltage for a motor is generated;
 program instructions that determine a change of output values of the hall sensor while rotating the rotor of the motor at a low speed;
 program instructions that store an offset value between a U-phase position and the hall sensor when the output values of the hall sensor changes; and
 program instructions that complete the control mode for applying the low speed rotating magnetic field.

12. The non-transitory computer readable medium of claim 11, further comprising:
 program instructions that enter a normal operation mode in which the hall sensor is configured to measure the position of the rotor of the motor when the offset compensation of the hall sensor is completed.

13. The non-transitory computer readable medium of claim 11, wherein in the determining of the change of the output values of the hall sensor, the change of the output values of the hall sensor is determined when the magnetic field applied to the U-phase position moves by unit of θm, by starting pulse width modulation (PWM) switching control to generate the magnetic field in the U-phase position of a three-phase coordinate system.

14. The non-transitory computer readable medium of claim 11, wherein in the storing of the offset value between the U-phase position and the hall sensor, when the movement distance θm of the magnetic field from the U-phase position is summed up to measure to the offset value between the U-phase position and the hall sensor.

15. The non-transitory computer readable medium of claim 11, wherein in the completing of the control mode, when 360/θm position becomes the U-phase position during the movement of the magnetic field, the control mode for applying the low speed rotating magnetic field is completed.

* * * * *